(12) United States Patent
Gunderson et al.

(10) Patent No.: US 8,729,917 B2
(45) Date of Patent: May 20, 2014

(54) INSPECTION DEVICE WITH VERTICALLY MOVEABLE ASSEMBLY

(75) Inventors: Gary Mark Gunderson, Issaquah, WA (US); Greg Olmstead, Sammamish, WA (US)

(73) Assignee: Rudolph Technologies, Inc., Flanders, NJ (US)

( * ) Notice: Subject to any disclaimer, the term of this patent is extended or adjusted under 35 U.S.C. 154(b) by 503 days.

(21) Appl. No.: 13/093,456

(22) Filed: Apr. 25, 2011

(65) Prior Publication Data

US 2012/0098563 A1 Apr. 26, 2012

Related U.S. Application Data

(60) Provisional application No. 61/327,220, filed on Apr. 23, 2010.

(51) Int. Cl.
*G01R 31/02* (2006.01)
*G01R 31/26* (2014.01)

(52) U.S. Cl.
USPC ............ 324/756.03; 324/750.19; 324/754.09; 324/754.23; 324/756.02

(58) Field of Classification Search
USPC .............. 324/754.01–756.05, 750.23, 754.23
See application file for complete search history.

(56) References Cited

U.S. PATENT DOCUMENTS

| | | | |
|---|---|---|---|
| 4,035,723 A | 7/1977 | Kvaternik | |
| 6,118,894 A | 9/2000 | Schwartz et al. | |
| 6,590,720 B2 | 7/2003 | Oba | |
| 6,710,798 B1 * | 3/2004 | Hershel et al. | 348/87 |
| 6,714,363 B2 | 3/2004 | Sasaki et al. | |
| 7,119,566 B2 * | 10/2006 | Kim | 324/750.19 |
| 7,561,353 B2 | 7/2009 | Shirakata | |
| 2001/0019275 A1 * | 9/2001 | Pace et al. | 324/753 |

FOREIGN PATENT DOCUMENTS

| | | |
|---|---|---|
| DE | 69800756 T2 | 8/2001 |
| DE | 10131665 A1 | 1/2003 |

* cited by examiner

*Primary Examiner* — Melissa Koval
*Assistant Examiner* — Emily Chan
(74) *Attorney, Agent, or Firm* — Dicke, Billig & Czaja, PLLC (57) ABSTRACT

The inspection of semiconductors or like substrates by the present mechanism minimizes deflection in the checkplate and probe card. An inspection device including a housing, a toggle assembly within the housing, an objective lens assembly attached within the toggle assembly including an objective coupled within an objective focus, wherein the objective focus is deflectable along an optics axis, and a cam assembly including a rotary cam and a window carrier, wherein the window carrier is moveable along the optics axis with rotation of the rotary cam, wherein the cam assembly is coupled to the toggle assembly with the objective and window are aligned along the optics axis.

10 Claims, 6 Drawing Sheets

SECTION A-A Fig. 2E

SECTION B-B Fig. 2F

INSPECTION DEVICE WITH VERTICALLY MOVEABLE ASSEMBLY

CROSS-REFERENCE TO RELATED APPLICATIONS

This application claims priority under 35 U.S.C. §119(e)(1) to U.S. Provisional Patent Application Ser. No. 61/327,220, filed Apr. 23, 2010, entitled "Inspection Device with Vertically Moveable Assembly"; and the entire teachings of which are incorporated herein by reference.

BACKGROUND

Probe cards used in testing integrated circuits during their manufacture require periodic assessment and maintenance to avoid damaging the integrated circuits. As part of the assessment and maintenance of probe cards, optical inspection devices are used to measure the X, Y and Z positions of probes in a probe card in order to determine whether the probes are planar and whether they are properly aligned with the set pattern of bond pads on a semiconductor wafer that the probes are intended to address. The devices may also predict the length and location of a scrub mark that would be formed in a bond pad based on measurements made using a fiducial plate (i.e. checkplate) in lieu of a semiconductor wafer with a bond pad.

Even though each probe is very small, the force needed to achieve the appropriate amount of scrubbing is several grams. Where there are hundreds or thousands of probes in a single probe card, the amount of force needed to overtravel the probes to achieve a proper scrub mark can be very high. Often, overtravel of all the probes occurs at once. For example, the device may have a conductive checkplate that is used to measure the Z height of each separately wired probe and the Z height of the lowest of a group of bussed probes (some probes are wired together making it impossible to electrically separate the signals from each one). In this Z height measurement process, the checkplate is driven into contact with all of the probes and the Z height of the checkplate is recorded when each probe (or group of probes) makes electrical contact.

In order to measure the XY position of probes, also referred to as alignment of the probes, images of the probes may be captured. In some instances, probes are located within the image and linear encoders of the stages on which the camera is mounted are used to help determine the XY position. In other instances, the position of the probes is related in an image to fiducial marks that are formed on windows. Due to the large forces involved in overtravelling all of the probes into contact with the fiducial plate, deflections in the inspection system and the probe card can result. Thus, it is desirable to minimize the applied forces.

In addition to minimizing the amount of force applied to a probe card, it is desirable to minimize the amount of wear to which a probe card and its probes are subject. For example, in systems such as that described in U.S. Pat. No. 5,657,394 and U.S. Pat. No. 6,118,894 it is necessary for probes to touch down each time an optical alignment measurement is taken. Even considering that multiple probes may be imaged together, where a probe card has many hundreds or thousands of probes, each probe and the probe card will be subjected to much unnecessary wear that inevitably leads to a shorter life for a probe card and its probes.

Accordingly, there is a need for a mechanism for analyzing probe cards that minimizes stresses placed on a probe card and its probes and which similarly minimizes wear to a probe card and its probes.

SUMMARY

The inspection of semiconductors or like substrates by the present mechanism minimizes deflection in the checkplate and probe card.

BRIEF DESCRIPTION

DETAILED DESCRIPTION

Figure 1:
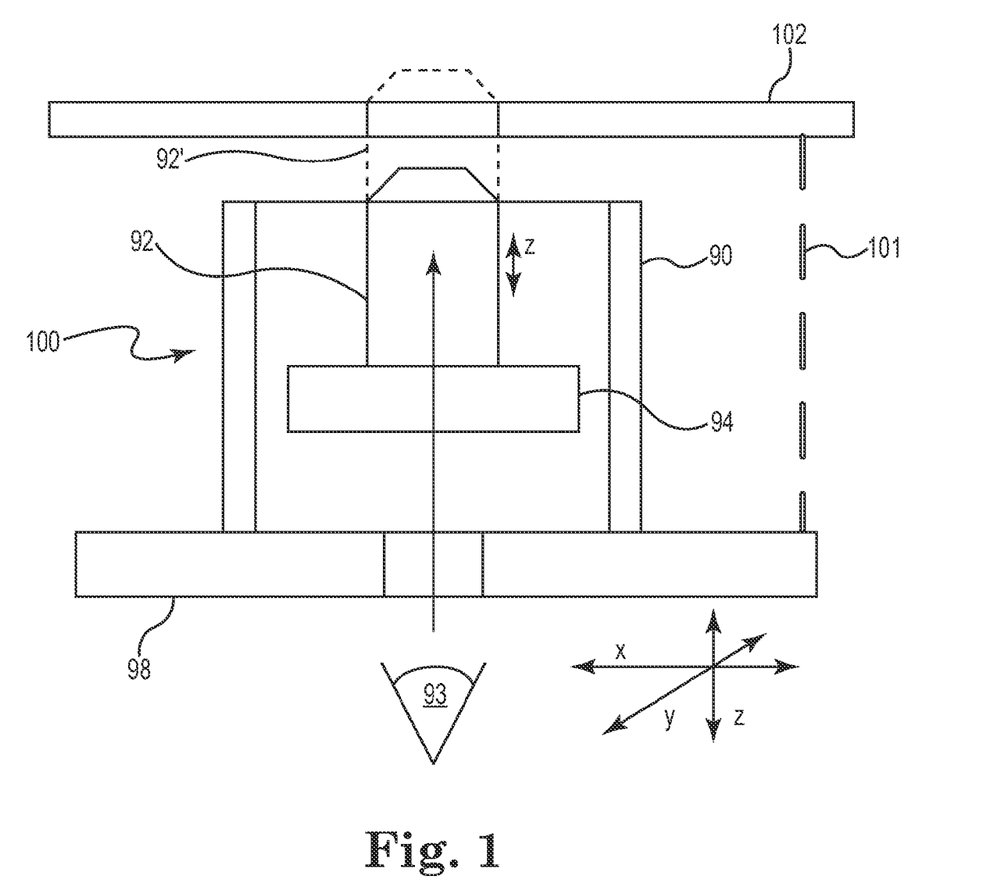
FIG. 1 is a schematic side view of an embodiment of an inspection device according to the present disclosure.

Some aspects in accordance with the present disclosure related to an inspection device for use with a checkplate and probe card. With this in mind one embodiment of an inspection device 100 is generally illustrated in FIGS. 1A and 1B and includes the checkplate 102 mounted independently from the recipicating mechanism that cycles the window/pin vertically up and down. This minimizes the complexity and the flexion of the entire assembly due to the effect of the other. Both the checkplate and the reciprocating mechanism are coupled to the XY and Z stages.

FIG. 1 is a schematic illustration of one embodiment of an inspection device 100. While the inspection device 100 will be described as it is used in the inspection of semiconductor probe card pins, it is to be kept in mind that the inspection device 100 may have applications outside of this specific use. In general the inspection device 100 has an outer body or housing 90, a carrier 92, and an actuator 94.

The carrier 92 is mounted within housing 90 and reciprocates vertically in the Z direction as noted by the arrow adjacent thereto. The carrier 92 moves between a first position, a retracted position, identified by numeral 92 and a second position, an extended position, identified by numeral 92'. In one embodiment, the carrier 92 is biased from its extended position 92' to its retracted position 92 by gravity. In the second position 92', an upper surface of the carrier 92 may contact an object that is under inspection. In some embodiments, this may be a probe or pin of a probe card. In other embodiments, the object under inspection (which is not shown in FIG. 1) may be some other object as the application requires. Note that the upper surface of the carrier 92 may deflect the object under inspection, but in all cases, moving the upper surface of the carrier 92 in contact with the object under inspection or at least moving the carrier close to the object under inspection will help to locate the object under inspection in the Z direction. That is, where there is contact with the upper surface of the carrier 92, the exact position of the object under inspection is known (even if contact has deflected or deformed the object). Similarly, if there is no contact between the upper surface of the carrier 92 and the object under inspection, one can know that the object is positioned outside of a range of desired or acceptable positions.

Contact between the carrier 92 and the object under test may be determined by electrical contact, as where the upper surface of the carrier 92 is provided with a conductive coating or where the upper surface of the carrier 92 is itself conductive. Contact may also be determined optically by viewing the object under test through the upper surface of the carrier 92. Note that where the upper surface of the carrier 92 is a substantially transparent window and where the inspection system 100 provides the necessary optical path, the object under inspection is on an optical axis that passes through a central passage through which light may pass of the carrier 92, and a camera or other imaging device 93 may be used to view the object under inspection through the inspection system 100.

In one embodiment, the housing 90, the carrier 92, and the actuator 94 of the inspection system 100 are mounted on a stage 98 that is moveable in at least an XY plane. Generally the object that is under test will remain stationary, though it is to be understood that in some applications, one skilled in the art may reverse this arrangement and make the object under inspection move in at least an XY plane with respect to the housing 90, the carrier 92, and the actuator 94. The stage 98 may also move in the Z direction, although in some embodiments and applications of the inspection system 100, the reciprocating motion of the carrier 92 may suffice for the all movements in the Z direction. Note that where contact is desired between the object under inspection and a check plate 102, it may be desirable to couple the check plate 102 to the stage 98 (as indicated by dashed line 101) such that the check plate 102 and the stage 98 move together. While shown in close proximity to one another in FIG. 1 (the check plate 102 having an aperture formed therethrough to allow the carrier 92 to extend through and above the upper surface of check plate 102), the check plate 102 and housing 90/carrier 92 assembly on a stage may be spatially separated such that the check plate 102 has an unbroken upper surface. In many embodiments, it may be desirable to avoid physically coupling the check plate 102 to the housing 90 to avoid deformation in either the housing 90/carrier 92/actuator 94 assembly and/or the check plate 102 due to contact between the object under inspection and either or both of the housing 90/carrier 92/actuator 94 assembly and/or the check plate 102.

As the embodiment shown in FIG. 1 is necessarily schematic in nature, one will readily appreciate that the inspection system 100 shown may be embodied in different physical modes.

Figure 2A:
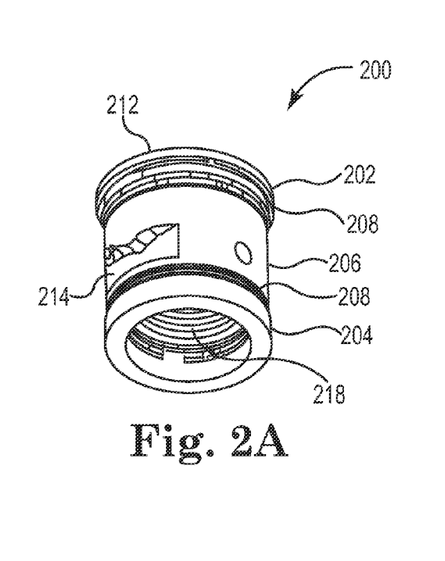
FIGS. 2A-2G are embodiments of an objective focus flexure according to the present disclosure.
Figures 2B, 2D:
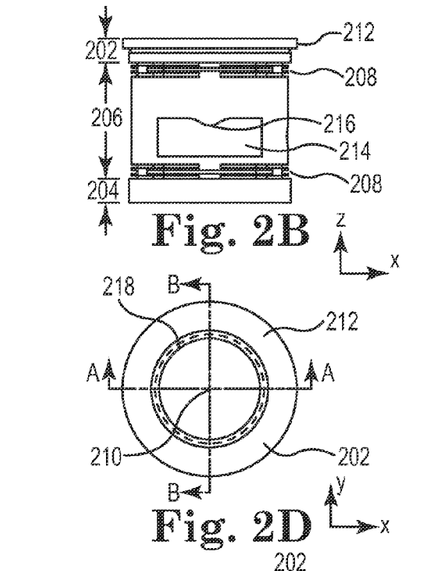
Figure 2C:
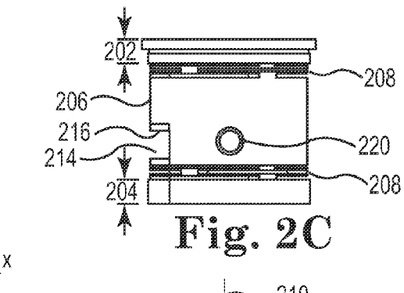
Figure 2E:
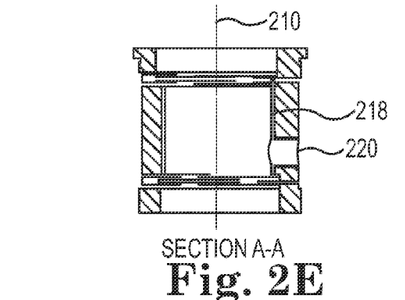
Figure 2F:
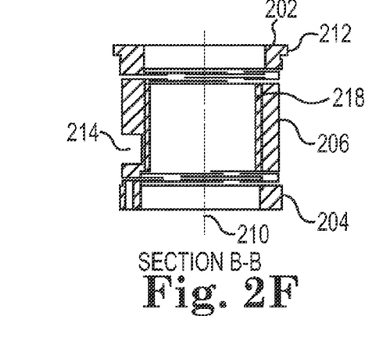

With the above in mind, and with reference to FIGS. 2B-2D, the inspection device 100 includes an objective focus flexure 200 and a cam assembly 300 which are described below in greater detail. In general terms, the objective focus flexure 200 holds the objective for focusing operates in conjunction with the reciprocating cam assembly 300 to ensure proper focus. Often a focal plane of the inspection device 100 will be fixed, but the position of the focal plane may also be modified. There are many uses for this flexure focusing device aside from probe card inspection. Any application where focal adjustment is desired might benefit from the present disclosure, including medical devices, camera or video devices, and various other manufacturing, testing and quality control devices.

With reference to FIGS. 2A-2G and 3A-3G, the objective focus flexure 200 is a hollow cylindrical component. The objective focus flexure 200 has a top section 202, an opposing bottom section 204, and a middle section 206 between the top section 202 and bottom section 204. Resilient couplings such as flexure points 208 are positioned at the regions of interface between the middle section 206 and the top section 202 as well as between the middle section 206 and the bottom section 204. The flexure points 208 are resilient in an axial direction of the objective focus flexure 200 and are substantially rigid in a radial direction of the objective focus flexure 200. In one embodiment, the objective focus flexure 200 is made of a single piece of material.

In one embodiment, the top section 202 includes a collar or flange 212 extending to the exterior of the objective focus flexure 200. The outer diameter of the collar/flange 212 is greater than the outer diameter of the body of the objective focus flexure 200. In one embodiment, the interior diameter is consistent through the top section 202 including the collar 212.

The middle section 206 includes a recess 214. In one embodiment, the depth "d" of the recess 214 is tapered into the body of the objective focus flexure 200. The recess 214 follows linearly along the x-axis while the body of the objective focus flexure 200 is circular. In one embodiment, the recess 214 includes a constriction point 216 along a z-axis. In one embodiment, the middle section 206 is at least partially threaded on an inner circumference 218. In one embodiment, the middle section 206 includes a set screw opening 220 to aid in setting and aligning the objective focus flexure 200 within a toggle assembly (not shown).

Figure 2G:
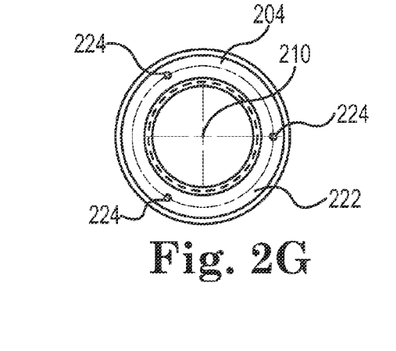
Figure 3A:
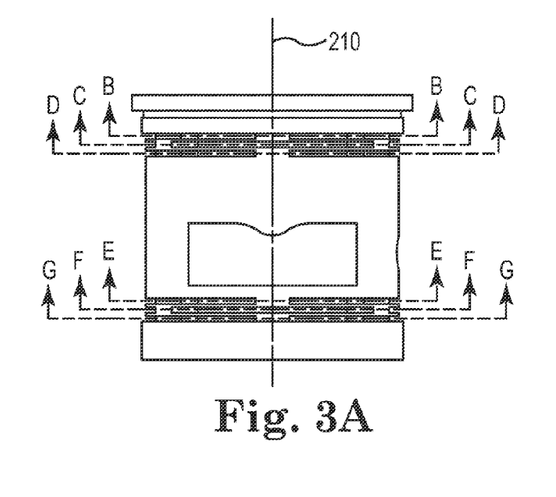
FIGS. 3A-3G are embodiments of an objective focus flexure according to the present disclosure.
Figure 3B:
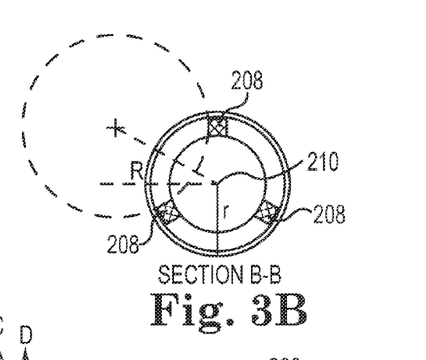
Figure 3C:
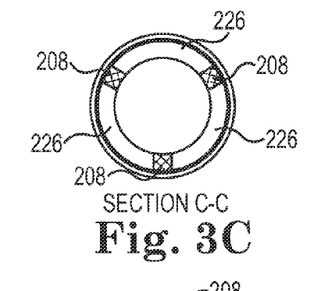
Figure 3D:
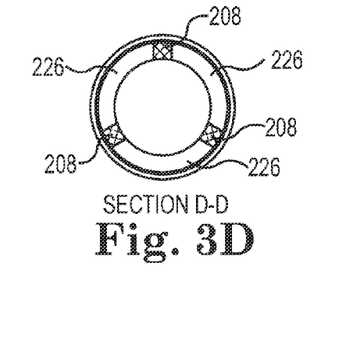
Figure 3E:
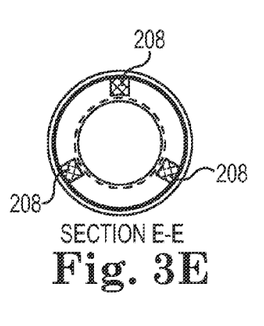
Figure 3F:
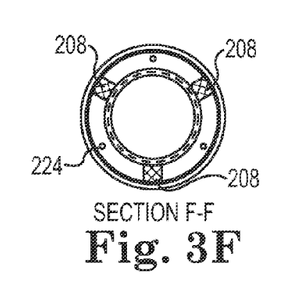
Figure 3G:
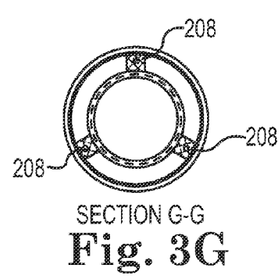

With reference to FIG. 2G, the bottom section 204 has a generally planar bottom face 222. In one embodiment, screw holes 224 at bottom face 222 are included for attachment of the objective lens flexure 200 into the toggle assembly.

As noted above, flexure points 208 are established at locations along the circumference of the objective focus flexure 200 at opposing ends of the middle section 206. Multiple cross-sections though the regions of the flexure points 208 are illustrated in FIGS. 3B-3G. In one embodiment, each of the flexure points 208 are configured to an extended radius "R" originated from the objective axis 210 of the objective focus flexure 200 to a point oriented exterior of the flexure, respectively. In one embodiment, the extended radius "R" is larger than the radius "r" of the exterior of the objective focus flexure 200. (See FIG. 3B)

In one embodiment, the flexure points 208 are a configured on a planar level and evenly spaced along the circumference of the objective focus flexure 200. FIGS. 3B-3G represent multiple planar levels according to one embodiment of the objective focus flexure 200. In one embodiment, there are at least two planar levels of flexure points 208, with each planar level including flexure points 208 offset from the adjacent planar level. In one embodiment, the flexure points 208 are evenly staggered along the circumference. In one embodiment, where there are at least three adjacent planar levels, alternating levels includes flexure points 208 at the same locations along the circumference, e.g. the first and third level include flexure points identically located along the circumference. (See FIGS. 3B and 3D, for example) In one embodiment, opposing sides of the flexure points 208 correspond to the outer circumference. The flexure points 208 connect on upper and lower faces to the adjacent level or the top section 202 or bottom section 204. Along the circumference, between the flexure points 208, voids 226 are formed by the absence of material. The voids 226 form a clearance within the levels/planes. In one embodiment, the voids 226 cover a large circumferential area than the flexure points 208. In a preferred embodiment, there are three adjacent planar levels which constrain five of six degrees of freedom.

In one embodiment, to adjust the focal point in position with the objective focus flexure 200, the middle section 206 adjusts along the optical axis 210 and the top section 202 and bottom section 204 remain fixed. Alternatively, the top section 202 and bottom section 204 adjust along the optical axis 210 and the middle section 206 remains fixed.

Figure 4A:
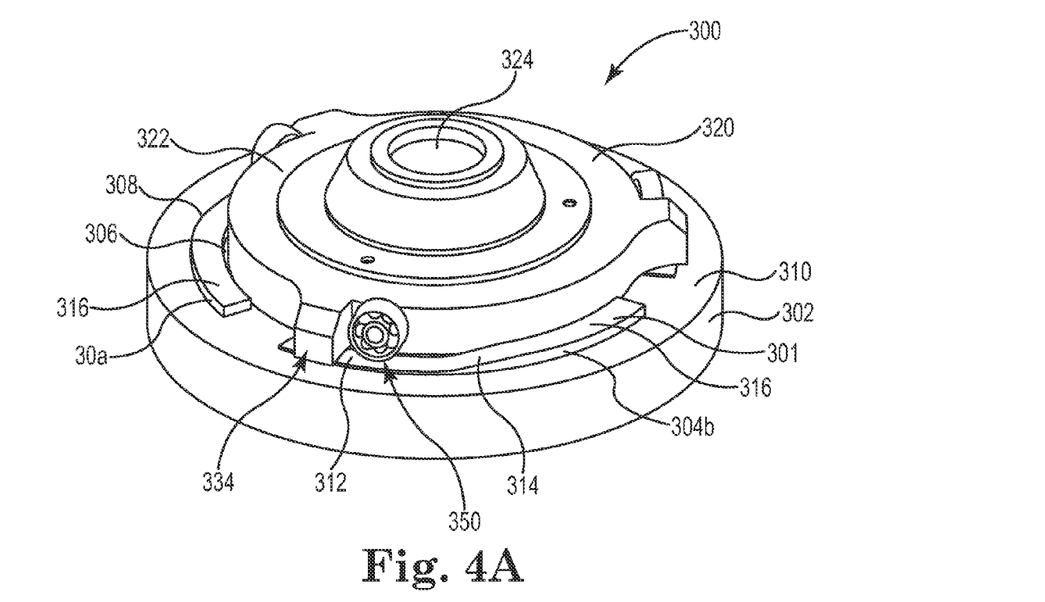
FIGS. 4A-4D are embodiments of a cam assembly according to the present disclosure.
Figure 4B:
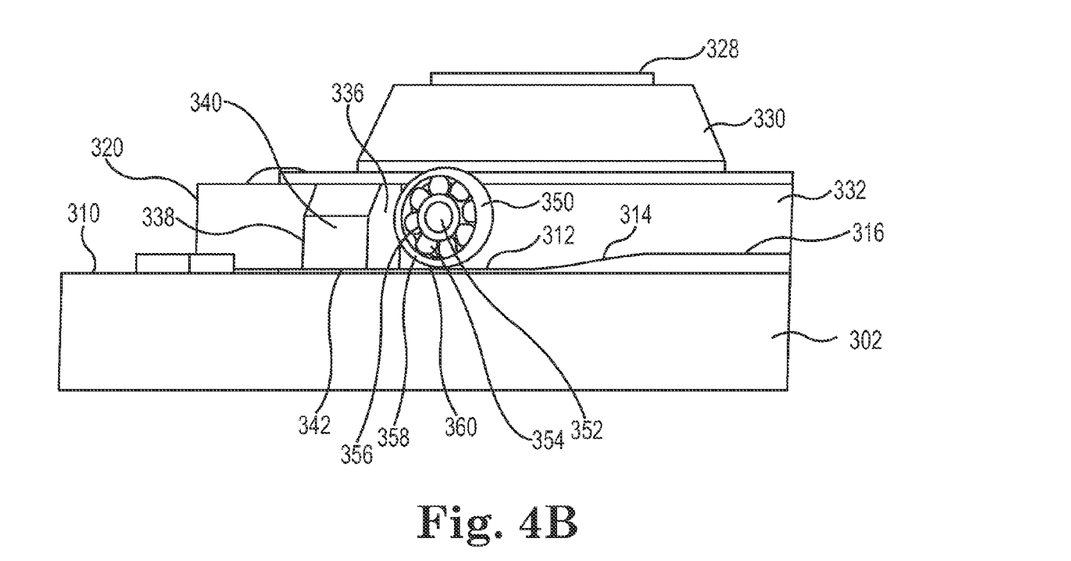
Figure 4C:
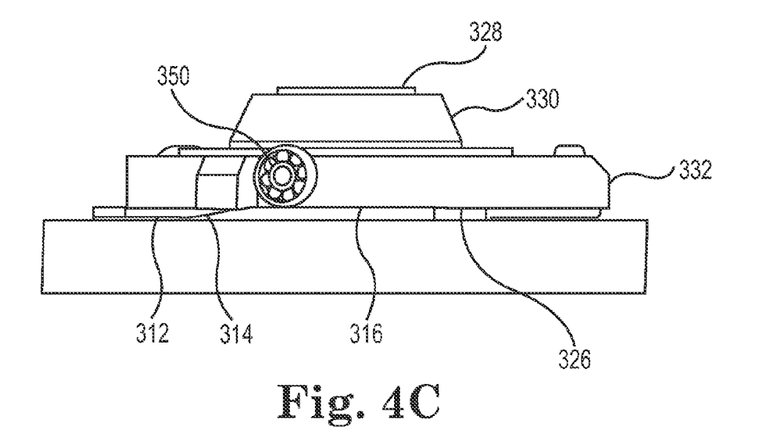
Figure 4D:
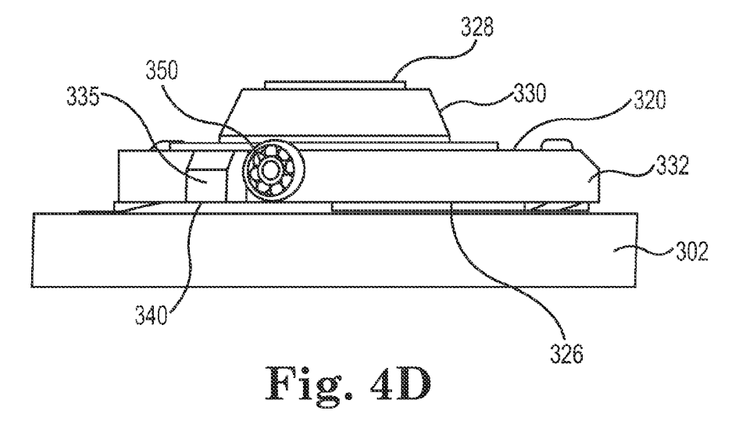

Turning now to an embodiment of the cam assembly 300 illustrated in FIGS. 4A-4D, an actuator 302 is disk shaped, hollow, cylindrical bodied rotary cam. The actuator 302 includes an open interior along a center axis. The cam assembly 300 has an actuating surface 301 including at least one ramp 304. The at least one ramp 304 has an inner radius 306 and an outer radius 308 and extends from a first planar surface 310 of the actuator 302. In one embodiment, the at least one ramp 304 includes an initial stepped surface 312, an inclining surface 314, and a terminating raised platform 316. In one embodiment, the at least one ramp 304 is a series of ramps 304 arranged in a circular pattern to form a ring-like shape. With particular reference to FIG. 4C, in one embodiment, the series of at least one ramp 304 are arranged such that the terminating raised platform 316 of a first ramp 304a is followed by the initial stepped surface 312 of a second ramp 304b. In one embodiment, there is a gap between each of the at least one ramps 304 wherein a length of the planar surface 310 is exposed. In one embodiment, the at least one ramp 304 are spaced equidistant from one another in a series.

In one embodiment, the inner radius 306 of the actuator 302 is configured to fit along the perimeter radius of a carrier 320. In one embodiment, the outside radius 308 of the at least one ramp 304 is smaller than the outside radius of the carrier 320, although they may be essentially equal. In one embodiment, the carrier 320 includes a multi-tiered top surface 322 and a hollow core 324 extending from the top surface 322 to an opposing bottom surface 326. In one embodiment, the top surface 322 includes a top ring 328, a beveled cone 330, and a lower ring 332 arranged concentrically extending from the hollow core 324, respectfully. The carrier 320 has an outer perimeter from which at least one hard point 334 project from. In one embodiment, and with particular reference to FIG. 4B, the at least one hard point 334 includes a leading edge 336, a following edge 338, and an outer edge 340 extending between the leading edge 336 and the following edge 338. In one embodiment, the at least one hard point 334 includes a bottom surface 342 which is planar with the bottom surface 326 of the window carrier 320. The carrier 320 may be assembled or formed from a single piece of suitable material.

With continued reference to FIGS. 4A-4D, at least one bearing assembly 350 has a shaft 352 extending from a center shaft opening in a bearing body 354. In one embodiment, the bearing body 354 is rotatable about the shaft 352. In one embodiment, the bearing body 354 contains bearing balls between an inner diameter wall 356 and exterior diameter wall 358. In one embodiment, the bearing body 352 includes an open face and a closed face. In one embodiment, the at least one bearing assembly 350 is coupled to the carrier 320 with the distal end of the shaft 352 inserted into a hole in the outer diameter of the carrier 320 adjacent to the at least one hard point 334. In one embodiment, the open face of the at least one bearing is proximal to the proximal end of the shaft 352. In one embodiment, the closed surface is adjacent to, but not in contact with, the outer perimeter of the carrier 320 and the leading edge 336 of the hard point 334. In one embodiment, the bearing assembly 350 is positioned such that an outer diameter 360 is not flush with the bottom surface 342 of the hard point 334. In one embodiment, the outer edge 340 of the at least one hard point 334 extends laterally beyond the exterior radius 308 of the at least one ramp 304.

The actuator 302 is rotatable relative to the carrier 320. In one embodiment, as the actuator 302 rotates in a counter-clockwise direction, the carrier 320 remains axially fixed. In this rotational manner, a bearing assembly 350 precedes each hard point 334. During rotation, the hard point 334 travels over the exposed first planar surface 310, then the bearing assembly 350 contacts the stepped surface 312 of the ramp 304 until the hard point 334 contacts the stepped surface 312, whereby the carrier 320 is axially raised a distance equally to the height of the stepped surface 312 above the first planar surface 310. In continuing the rotation, the bearing 350 intercepts the inclining surface 314 of the ramp 304 and the hard point 334 lifts free. After the bearing 350 crests the terminating raised platform 316, the leading edge 336 of the hard point 334 makes contact with the terminating raised platform 316. As the actuator 302 continues to rotate, the leading edge 336 of the hard point 334 travels over the upper edge of the terminating raised platform 316 until the bearing 350 lifts free. As the actuator 302 rotates to its final position, the bottom surface 342 of the hard point 334 slides along the terminating raised platform 316, further raising the carrier 320 above the actuator 302. In one embodiment, there is a gap (e.g. 3 mils) between the outer diameter 360 of the bearing assembly 350 and planar surfaces of the at least one ramp 304 and planar surface 310 when hard point 334 is in contact with the actuating surface 301.

Figures 5A, 5B:
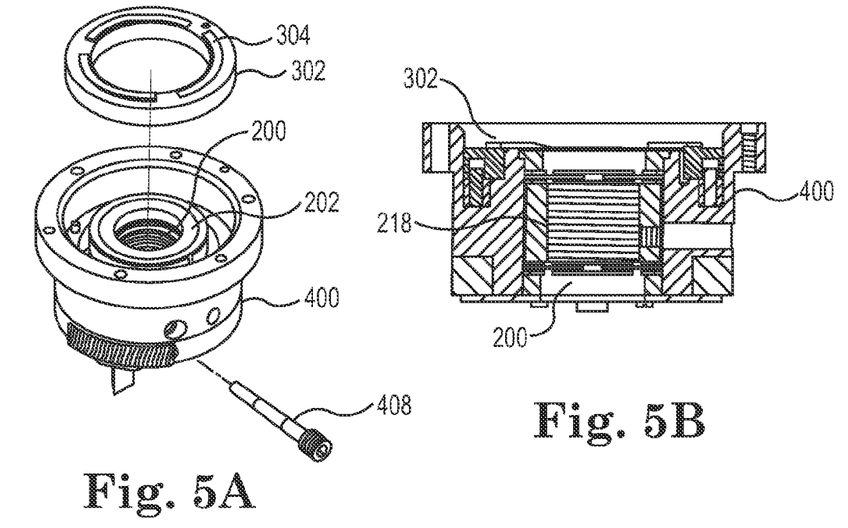
FIGS. 5A-5C are embodiments of a housing, carrier, actuator assembly according to the present disclosure.

As assembled, for example in a semiconductor inspection device embodied in FIG. 5B, the objective focus flexure 200, as a focusing mechanism, is assembled within the central passage of a housing 400. In one embodiment, the middle section 206 of the objective focus flexure 200 is coupled to the housing 320 and the top section 202 and the bottom section 204 are free to move with respect to the housing 400. In another embodiment, the top section 202 and the bottom section 204 of the objective focus flexure are coupled to the housing 400 and the middle section 206 is free to move with respect to the housing 400. The actuator 302 is positioned within the housing 400 at the top end 202 of the objective focus flexure 200.

Figure 5C:
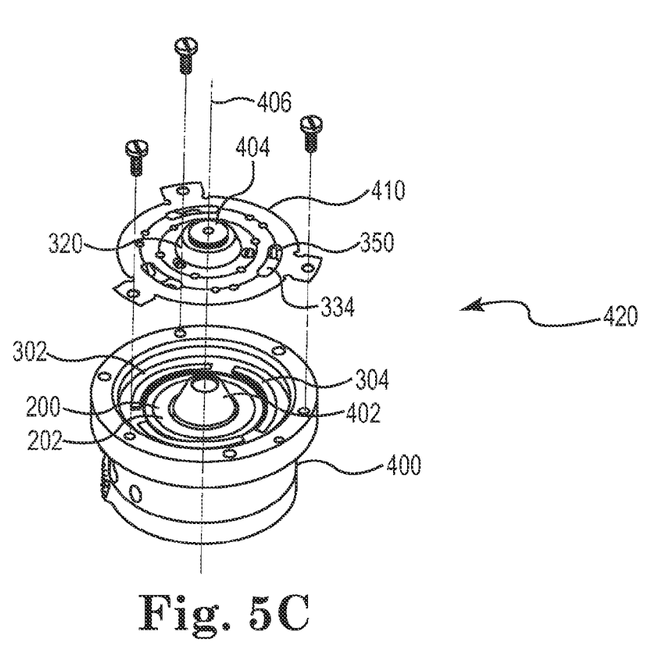

The actuator 302 is positioned within the housing 400 such that at least one actuating surface 301 of the actuator 302 may selectively bear against at least one bearing surface of the carrier 320, the actuator 302 being actuatable between a first position in which the bearing surface permits the carrier 320 to remain or return to its retracted position and a second position in which force is exerted by the at least one actuating surface against the at least one bearing surface of the carrier 320 to move the carrier 320 to its extended position. An objective 402 is inserted within the objective focus flexure 200 and the housing. The objective 402 is fit inside the objective focus flexure 200 and moveably secured with by threading the objective 402 into the middle section threads 218 of the objective focus flexure 200. Where the middle section 206 of the objective focus flexure 200 is coupled to the carrier 92, the objective 402 is coupled to the middle section 206 such that the middle section 206 of the objective focus flexure 200 moves along an optical axis 406 of the optical element. Alternatively, where the top section 202 and the bottom section 204 are coupled to the carrier 320, the objective 402 is coupled between the top section 202 and the bottom section 206 of the objective focus flexure 200 such that the top section 202 and the bottom section 206 of the objective focus flexure 200 move in conjunction with one another and with the objective 402 along an optical axis 406 of the objective 402. The carrier 320, with a window 404 secured to the top ring 328 is coupled to the toggle assembly 400. As illustrated in FIGS. 5A and 5C, a resilient member 410 is coupled between the carrier 320 and the housing 400, the resilient member 410 being resilient in an axial direction defined by movement of the carrier 320 between its retracted and extended positions and largely rigid with respect to relative rotation of the carrier 320 within the housing 400 around the axial direction. The window 404 is assembled over a projecting end of the objective 402 oriented proximal to the top section 202 of the objective focus flexure 200. The objective 402 assists in maintaining the top section 202 and bottom section 204 in a planar parallel relation to one another.

With reference to the above, rotation of the actuator 302 rotates causing the carrier 320 and window 404 to vertically adjust as the hard points 334 and bearings 350 move along the inclined ramps 304. An objective focus mechanism 408 is an adjustment mechanism that engages the objective focus flexure 200 at the recess 214 within the toggle assembly 420 and is adjusted along the optics axis 210. In one embodiment, the objective focus mechanism 408 is coupled between the housing 400 and at least one of the top section 202 and the bottom section 204 of the objective focus flexure 200, and actuation of the objective focus mechanism 402 results in relative translation of the at least one of the top section 202 and bottom section 204 with respect to the housing 400. In another embodiment, the objective focus mechanism 408 is coupled between the housing 400 and the middle section 206 of the objective focus flexure 200, and actuation of the objective focus mechanism 402 results in relative translation of the middle section 206 with respect to the housing 400. The flexure points 208 of the objective focus flexure 200 deform upon actuation and there is substantially zero deflection from a planar parallel position.

The cam assembly 300 and objective flexure focus 200, in accordance with principles of the present disclosure, can be assembled and used as part of an inspection system.

Although the present disclosure has been described with reference to preferred embodiments, workers skilled in the art will recognize that changes can be made in form and detail without departing from the spirit and scope of the present disclosure.

What is claimed is:

1. An inspection device comprising:
    a carrier having a central passage through which light may pass and a window positioned over an upper opening of the central passage, the window being substantially transparent;
    a housing, wherein the carrier is disposed within the housing and is reciprocable between a retracted position and an extended position;
    an actuator positioned within the housing such that at least one actuating surface of the actuator is actuatable to bear against at least one bearing surface of the carrier, the actuator being actuatable between a first position in which the bearing surface permits the carrier to remain or return to its retracted position and a second position in which force is exerted by the at least one actuating surface against the at least one bearing surface of the carrier to move the carrier to its extended position; and
    a focusing mechanism disposed in the central passage of the carrier, wherein the focusing mechanism includes
    a flexure having a middle portion that is coupled to a top section and to a bottom section by resilient couplings, the top section and bottom section being on opposite sides of the middle portion.

2. The inspection device of claim 1, wherein the middle portion of the flexure is coupled to the housing and the top and bottom sections are free to move with respect to the housing.

3. The inspection device of claim 2, further comprising an optical element coupled between the top and bottom sections of the flexure such that the top and bottom sections of the flexure move in conjunction with one another and with the optical element along an optical axis of the optical element.

4. The inspection device of claim 2, further comprising an adjustment mechanism coupled between the housing and at least one of the top and bottom sections of the flexure, actuation of the adjustment mechanism resulting in the relative translation of the at least one of the top and bottom sections with respect to the housing.

5. The inspection device of claim 1, wherein the top and bottom sections of the flexure are coupled to the housing and the middle portion is free to move with respect to the housing.

6. The inspection device of claim 5, further comprising an optical element coupled to middle portion of the flexure such that the middle portion of the flexure moves along an optical axis of the optical element.

7. The inspection device of claim 5, further comprising an adjustment mechanism coupled between the housing and the middle portion of the flexure, actuation of the adjustment mechanism resulting in the relative translation of the middle portion with respect to the housing.

8. The inspection device of claim 1, wherein the resilient couplings between the middle portion and the top and bottom sections are resilient in an axial direction of the flexure and are substantially rigid in a radial direction of the flexure.

9. The inspection device of claim 8, wherein the resilient couplings between the middle portion and the top and bottom sections deform upon actuation so as to maintain the top and bottom sections and the middle portion in substantially planar parallel relation to one another.

10. The inspection device of claim 9, further comprising an optical device coupled to the flexure which at least on part acts to maintain the top and bottom sections in a planar parallel relation to one another.

* * * * *